(12) United States Patent
Lai et al.

(10) Patent No.: US 11,543,267 B2
(45) Date of Patent: Jan. 3, 2023

(54) POSITION SENSING MECHANISM

(71) Applicant: HIWIN MIKROSYSTEM CORP., Taichung (TW)

(72) Inventors: Chih-Huang Lai, Taichung (TW); Chia-Chang Lee, Taichung (TW); Zhi-Hao Xu, Taichung (TW); Heng-Sheng Hsiao, Taichung (TW)

(73) Assignee: HIWIN MIKROSYSTEM CORP., Taichung (TW)

( * ) Notice: Subject to any disclaimer, the term of this patent is extended or adjusted under 35 U.S.C. 154(b) by 24 days.

(21) Appl. No.: 17/141,956

(22) Filed: Jan. 5, 2021

(65) Prior Publication Data

US 2022/0214192 A1   Jul. 7, 2022

(51) Int. Cl.
 *G01D 5/14* (2006.01)
 *G01B 7/00* (2006.01)
 *G01R 33/09* (2006.01)

(52) U.S. Cl.
 CPC ............. *G01D 5/145* (2013.01); *G01B 7/003* (2013.01); *G01R 33/09* (2013.01)

(58) Field of Classification Search
 CPC ......... G01D 5/145; G01B 7/003; G01R 33/09
 See application file for complete search history.

(56) References Cited

U.S. PATENT DOCUMENTS

| | | | |
|---|---|---|---|
| 7,215,112 B1 * | 5/2007 | Recio | G01D 5/2452 324/207.13 |
| 7,602,178 B2 | 10/2009 | Hehn et al. | |
| 7,994,775 B2 * | 8/2011 | Shiao | G01D 5/2457 324/207.24 |
| 10,859,402 B2 | 12/2020 | Duret | |
| 2009/0059444 A1 * | 3/2009 | Mather | B82Y 25/00 360/324.11 |
| 2010/0296202 A1 | 11/2010 | Boone, Jr. et al. | |
| 2013/0063841 A1 | 3/2013 | Braganca et al. | |
| 2020/0182947 A1 | 6/2020 | Pannetier-Lecoeur et al. | |

FOREIGN PATENT DOCUMENTS

| | | |
|---|---|---|
| DE | 102018211216 A1 | 1/2020 |
| EP | 2589975 A2 | 5/2013 |
| EP | 2955487 A1 | 12/2015 |
| EP | 3413311 A1 | 12/2018 |
| JP | 2010133851 A | 6/2010 |
| JP | 2015200551 A | 11/2015 |
| JP | 2016183904 A | 10/2016 |

* cited by examiner

*Primary Examiner* — Reena Aurora
(74) *Attorney, Agent, or Firm* — Guice Patents PLLC

(57) ABSTRACT

A position sensing mechanism provided by the invention comprises an encoding element as a sensing signal source, a reading element for sensing signals of the signal source, and a processing unit for receiving and analyzing sensing signals output by the reading element, the position sensing mechanism has a main technical feature lying in a magneto-resistive unit in the reading element for sensing signals of the signal source being a tunneling magneto-resistor (TMR), and two layers of magnetic moments of a reference layer and a free layer of the tunneling magneto-resistor being perpendicular to each other, and in the reference layer and the free layer with the magnetic moments being perpendicular to each other, the magnetic moment of one of the layers is parallel to a film surface, and the magnetic moment of the other layer is perpendicular to the film surface.

10 Claims, 4 Drawing Sheets

POSITION SENSING MECHANISM

BACKGROUND OF THE INVENTION

Field of Invention

The invention relates to sensing technology, and more particularly to a position sensing mechanism that uses a tunneling magneto-resistor for sensing positions.

Related Art

The sensing technology for position analysis by sensing changes of a specific signal such as magnetism or light in an encoding element under changes in position is a widely used technical means in the prior art. Specifically, for example, in the previous U.S. Pat. No. 6,100,681A, it uses two sets of Hall sensor chips with a position difference of 90 degrees relative to each other to sense position changes along a moving direction. Or, as disclosed in the patent publication US20090102461A, in the technology provided by the encoding element that uses magnetism as the signal source, the two magnetic tracks provided are set to the binary system and the decimal system, and then a plurality of discrete Hall sensing elements are used to sense the changes in the magnetic field of each of the magnetic tracks respectively, and the changes in the magnetic fields are analyzed to obtain position information. In such a technical means of using the Hall elements as the magnetic sensing elements, although it is a common technique in the position sensing technology, due to the high power consumption and low sensitivity of the Hall element itself, it still has its limitations as a position sensing element, especially in applications that require low power consumption and high sensing sensitivity, and therefore the Hall sensing element has been unable to meet the requirements of the industry.

Further, as disclosed in the U.S. Pat. No. 10,480,963 shown in FIG. 1 in the prior art, although it also uses the Hall sensor 1 as a sensing element for the absolute column magnetic track 2, and in the sensing of the incremental column magnetic track 3, magneto-resistive element such as the spin-valve tunneling magneto-resistive (SV TMR) element 4 or the anisotropic magneto-resistive (AMR) element with relatively low-power and high-sensitivity is used as a sensing element to obtain better sensing sensitivity; however, the spin-valve tunneling magneto-resistive element 4 or the anisotropic magneto-resistive element obtains position analysis information by sensing changes of a magnetic field angle caused by the movement of the magnetic track, and in order to accurately sense changes of the magnetic field angle in the incremental column magnetic track 3, a film surface of the spin-valve tunneling magneto-resistive element 4 or the anisotropic magneto-resistance element must be located on the x-z plane, resulting in the absolute column magnetic track sensing element on the x-y plane, that is, the Hall sensor 1, being in a spatial state of locating on a different plane, which leads to the need of manufacturing each of sensing components of the absolute column and the incremental column individually as parts, and then separately aligning the components precisely before assembling them on a base plate (not shown in the figure); as a result, the assembly procedures and costs are not only increased, but the accuracy of alignment also affects the accuracy of position determination, and therefore it is difficult to effectively improve the yield of the product.

SUMMARY OF THE INVENTION

Therefore, a main object of the invention is to provide a position sensing mechanism, which uses tunneling magneto-resistance for sensing of positions, and sensing elements are directly formed on a base plate to obtain an integrated sensor with a plurality of sensing elements, thereby avoiding assembly procedures of assembling the sensing elements on the base plate as independent discrete parts, and ensuring that ab accuracy of position sensing is not affected by poor assembly procedures.

In order to achieve the above object, the position sensing mechanism provided by the invention comprises an encoding element as a sensing signal source, a reading element for sensing signals of the signal source, and a processing unit for receiving and analyzing sensing signals output by the reading element, the position sensing mechanism has a main technical feature lying in a magneto-resistive unit in the reading element for sensing signals of the signal source being a tunneling magneto-resistor (TMR), and two layers of magnetic moments of a reference layer and a free layer of the tunneling magneto-resistor being perpendicular to each other, and in the reference layer and the free layer with the magnetic moments being perpendicular to each other, the magnetic moment of one of the layers is parallel to a film surface, and the magnetic moment of the other layer is perpendicular to the film surface.

Wherein the magnetic moment perpendicular to the film surface can be the reference layer or the free layer.

DETAILED DESCRIPTION OF THE INVENTION

Figure 1:
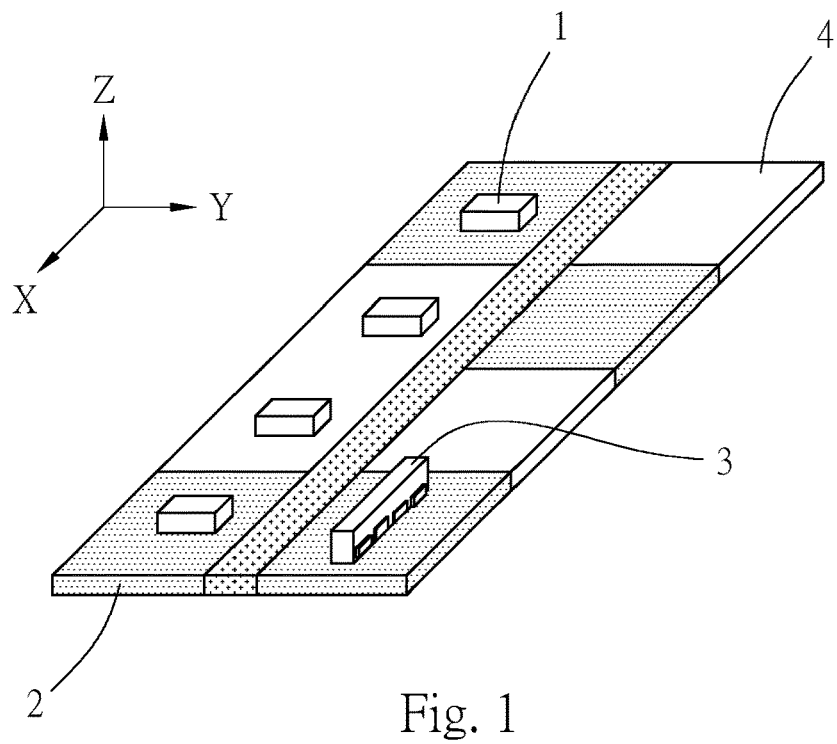
FIG. 1 is a perspective view of a prior art.
Figure 2:
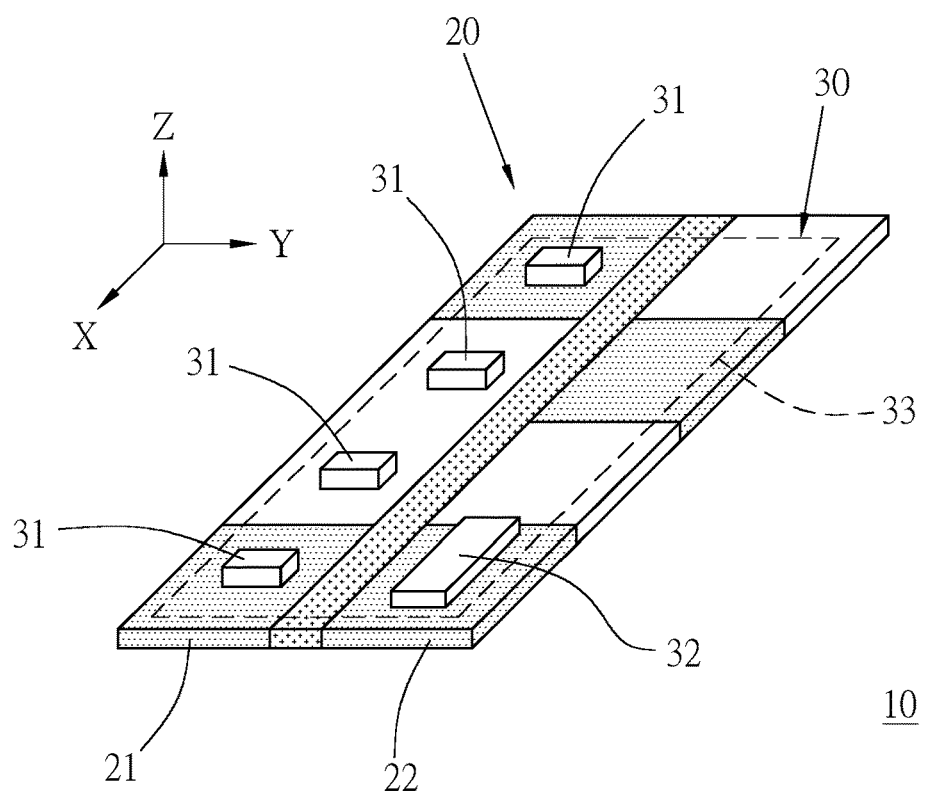
FIG. 2 is a perspective view of a preferred embodiment of the invention.

First of all, please refer to FIG. 2, a position sensing mechanism 10 provided in a preferred embodiment of the invention mainly comprises an encoding element 20, a reading element 30, and a processing unit (not shown in the figure).

The encoding element 20 is a conventional magnetic ruler technology that uses magnetic field as a signal source, the encoding element 20 structurally comprises an absolute column magnetic track 21 and an incremental column magnetic track 22, the absolute column magnetic track 21 and the incremental column magnetic track 22 extend side by side with each other along a virtual moving axis, and magnetic poles are changed on an x-y plane shown in FIG. 2 according to a preset encoding method. Generally, the moving axis is usually linear and consistent with a longitudinal direction of the magnetic ruler, however, regarding the magnetic ruler technology that comprises the absolute column magnetic track 21 and the incremental column magnetic track 22, since it is the technical content that is known to those having ordinary skill in the art to which the invention pertains prior to the application of the invention, the specific magnetic poles arrangement, manufacturing process, or related technology will not be described here.

The reading element 30 comprises first magneto-resistive units 31 and a second magneto-resistive unit 32, a quantity of each of the magneto-resistive units can be set according to actual requirements, and the quantity does not hinder the achievement of the technical features of the invention, so the numerical value of the quantity will not be further explained. As for the reading element 30 as a whole, the reading element 30 is separated from the encoding element 20 and adjacent to one side of the encoding element 20, and a projection range of the reading element 30 toward the encoding element 20 is capable of covering the absolute column magnetic track 21 and the incremental column magnetic track 22, so that between the reading element 30 and the encoding element 20, whether the reading element 30 is moved relative to the encoding element 20 or the encoding element 20 is moved relative to the reading element 30, when both of the reading element 30 and the encoding element 20 produce relative displacement on the moving axis, changes of magnetic fields of the incremental column magnetic track 22 and the absolute column magnetic track 21 can be sensed by the reading element 30. Specifically, the first magneto-resistive units 31 correspond to the absolute column magnetic track 21 to sense changes of magnetic field of the absolute column magnetic track 21 in the above-mentioned relative displacement state. The second magneto-resistive unit 32 corresponds to the incremental column magnetic track 22 to sense changes of magnetic field of the incremental column magnetic track 22 in the above-mentioned relative displacement state. Thereby, after the absolute column magnetic track 21 and the incremental column magnetic track 22 are sensed by the first magneto-resistive units 31 and the second magneto-resistive unit 32, sensing signals are output, and the processing unit is capable of analyzing relative positions of the reading element 30 and the encoding element 20 based on the sensing signals in order to obtain information of moved positions to be provided for the control of driving components such as linear motor or rotary motor.

Figure 3:
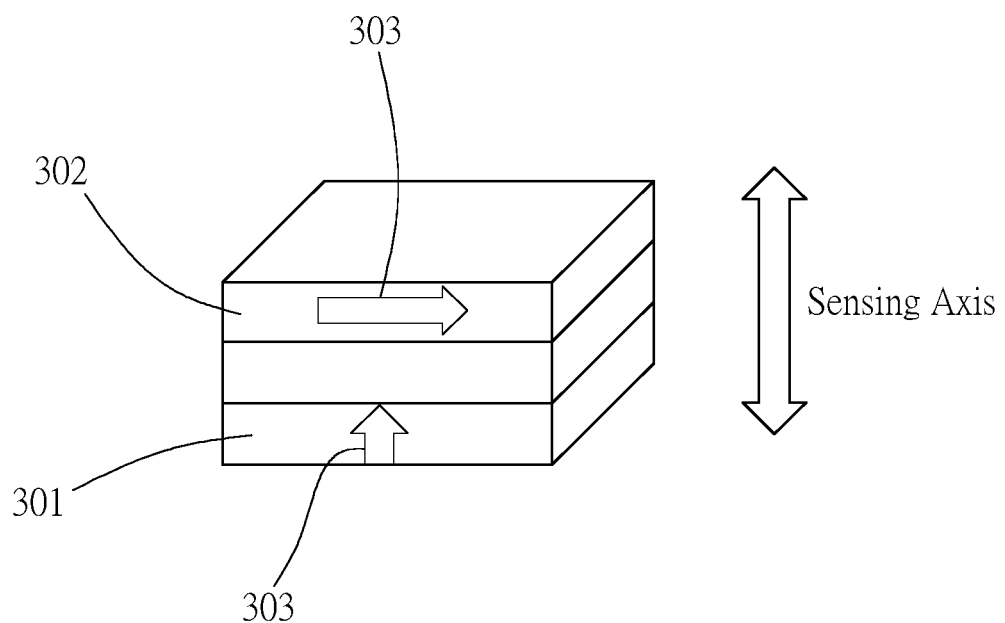
FIG. 3 is a plan view of a tunneling magneto-resistor as a magneto-resistive unit in a preferred embodiment of the invention.
Figure 4:
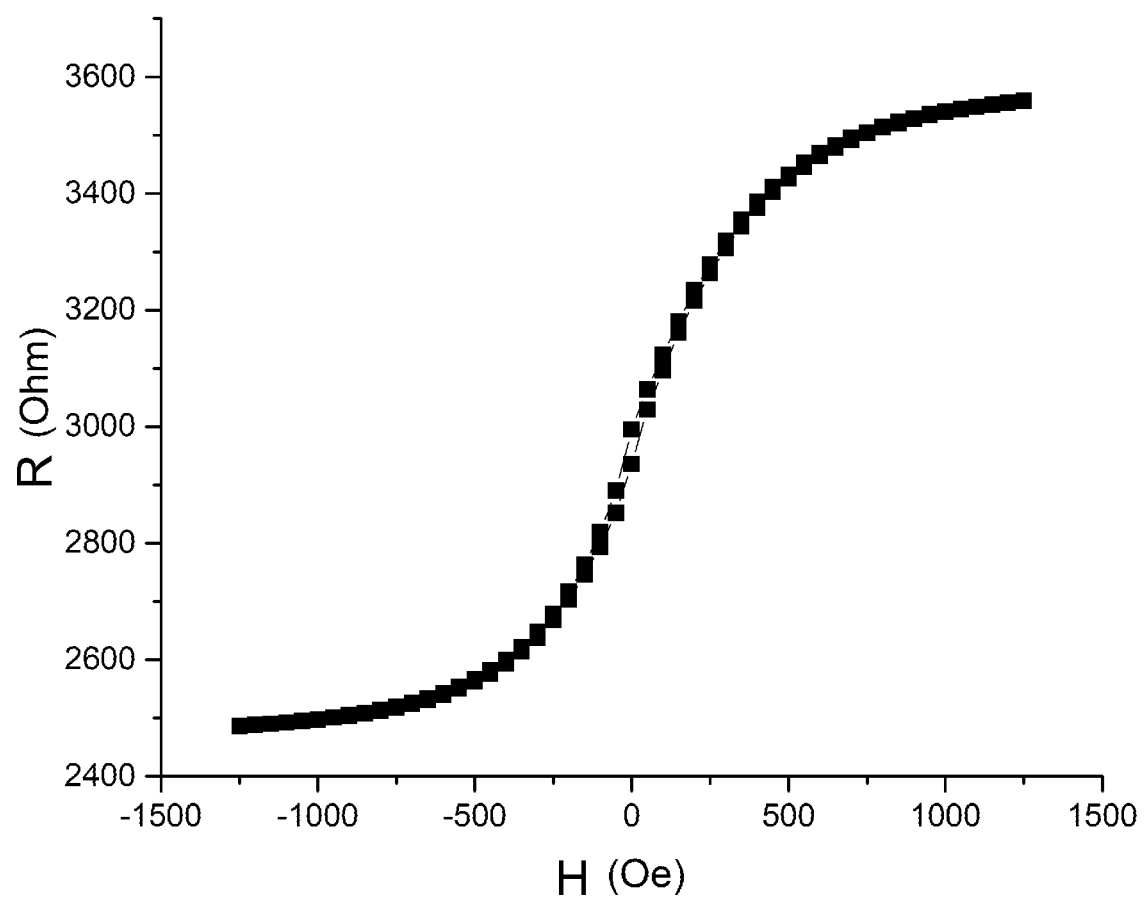
FIG. 4 is a diagram of relationship between resistance and magnetic field in a preferred embodiment of the invention.

It is necessary to further explain that the first magneto-resistive units 31 and the second magneto-resistive unit 32 are different from the conventional technology employing different sensing elements for the absolute and incremental columns, but instead both the first magneto-resistive units 31 and the second magneto-resistive unit 32 have the same technical structure, and as disclosed in this embodiment, both the first magneto-resistive units 31 and the second magneto-resistive unit 32 have a tunneling magneto-resistive (TMR) structure as shown in FIG. 3. However, the first magneto-resistive unit 31 can be a tunneling magneto-resistor with a single magnetic tunneling junction (single MTJ), and the second magneto-resistive unit 32 is a bridge tunneling magneto-resistor (bridge TMR), two layers of magnetic moments 303 of a reference layer 301 and a free layer 302 composing the tunneling magneto-resistor are perpendicular to each other, the magnetic moment 303 of the reference layer 301 is perpendicular to a film surface, and the magnetic moment 303 of the free layer 302 is parallel to the film surface, so that the magnetic moments 303 of the reference layer 301 and the free layer 302 have an orthogonal anisotropy, and a sensing film surface of the tunneling magneto-resistor is located on the x-y plane shown in FIG. 2. Accordingly, the resistor of tunneling magneto-resistance is capable of producing linear changes shown in FIG. 4 for changes of an externally applied magnetic field in a vertical direction (sensing axis shown in FIG. 3 being a z-direction shown in FIG. 2).

Figure 5:
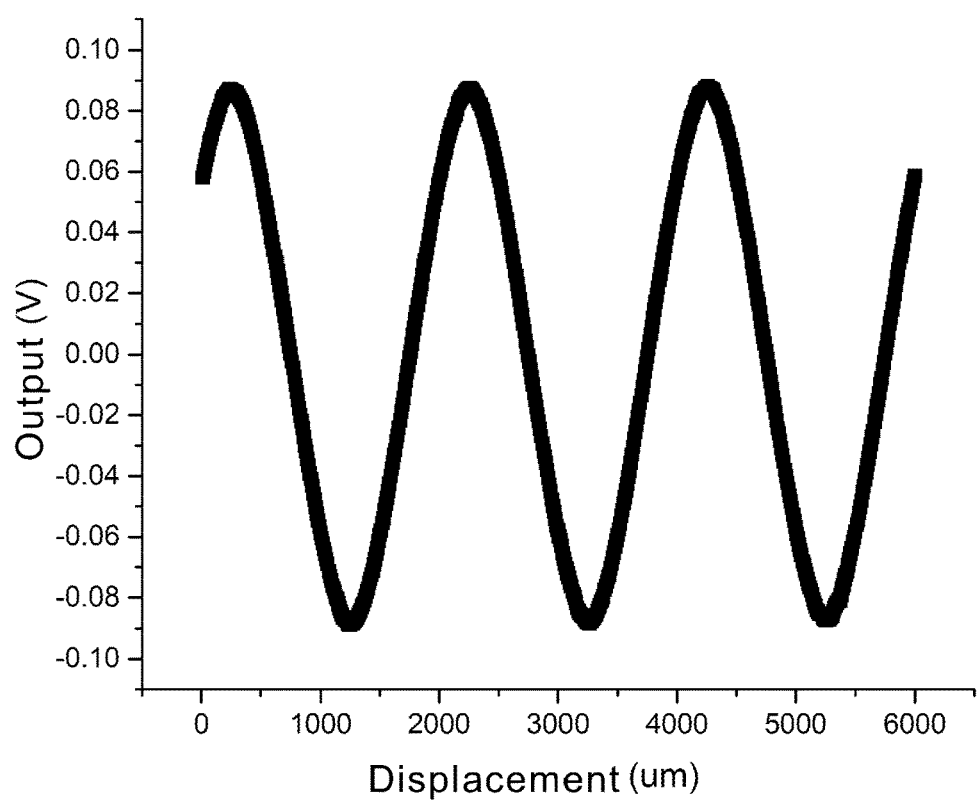
FIG. 5 is a waveform diagram of a sensing signal for an incremental column in a preferred embodiment of the invention.
Figure 6:
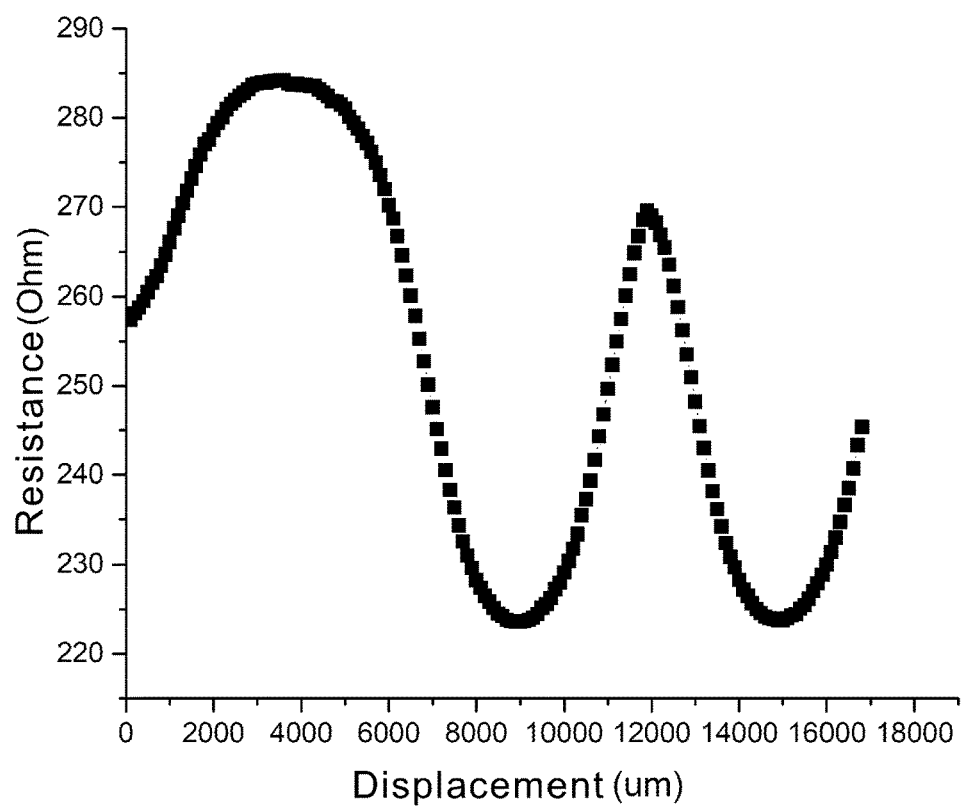
FIG. 6 is a waveform diagram of a sensing signal for an absolute column in a preferred embodiment of the invention.

Furthermore, the sensing film surface of the tunneling magneto-resistor of the second magneto-resistive unit 32 located on the x-y plane shown in FIG. 2, can be affected by a sine wave field in the z-direction shown in FIG. 2 generated by the incremental column magnetic track 22 to generate a sensing signal shown in FIG. 5. Furthermore, for the sensing film surface of the tunneling magneto-resistor of the first magneto-resistive unit 31 located on the x-y plane shown in FIG. 2, it is only required to determine positive or negative magnetic field of the absolute column magnetic track 21 in the z-direction shown in FIG. 2. Therefore, under the above-mentioned relative displacement, the free layer 302 in the tunneling magneto-resistor of the first magneto-resistive unit 31 will change direction as the magnetic pole changes, while the reference layer 301 will be maintained in a same direction, resulting in a difference between high and low resistances generating a sensing signal shown in FIG. 6 to determine its magnetic pole polarity.

With the orthogonal anisotropy of the magnetic moments 303 between the reference layer 301 and the free layer 302 of the tunneling magneto-resistors, magnetic field changes of the absolute column magnetic track 21 and the incremental column magnetic track 22 in the magnetic ruler can be sensed with the tunneling magneto-resistors with the same structure to obtain the correct position information.

More importantly, in addition to the first magneto-resistive units 31 and the second magneto-resistive unit 32 having the same structure, positions of the first magneto-resistive units 31 and the second magneto-resistive unit 32 relative to the encoding element 20 are also based on the same plane, that is the x-y plane shown in FIG. 2. In this way, predetermined quantities of the first magneto-resistive units 31 and the second magneto-resistive unit 32 with defined relative positions that are composed of the tunneling magneto-resistor can be formed on a base plate 33 (indicated by a dotted line in FIG. 2) together with the same thin film deposition, photolithography and etching procedures used in the conventional semiconductor manufacturing process. Thus, the drawbacks caused by the need to assemble different discrete sensing elements as in the prior art can be eliminated in order to obtain the position sensing mechanism of the invention that does not require assembly of sensing elements to ensure sensing accuracy.

It is to be understood that the above description is only preferred embodiments of the present invention and is not used to limit the present invention, and changes in accordance with the concepts of the present invention may be made without departing from the spirit of the present invention, for example, the equivalent effects produced by various transformations, variations, modifications and applications made to the configurations or arrangements shall still fall within the scope covered by the appended claims of the present invention.

What is claimed is:

1. A position sensing mechanism comprising:
   an encoding element having an absolute column magnetic track and an incremental column magnetic track extending side by side with each other along a virtual moving axis;
   a reading element adjacent to and spaced apart from the encoding element, and changing in position relative to the encoding element on the virtual moving axis, the reading element having a first magneto-resistive unit acted on by the absolute column magnetic track, and a second magneto-resistive unit acted on by the incremental column magnetic track; and a processing unit electrically connected to the reading unit for receiving signals generated by the first magneto-resistive unit and the second magneto-resistive unit under actions of the absolute column magnetic track and the incremental column magnetic track respectively, and analyzing positions with the signals received;

characterized in that:

the first magneto-resistive unit and the second magneto-resistive unit are tunneling magneto-resistors (TMR) respectively, each said magneto-resistive unit of the first magneto-resistive unit and the second magneto-resistive unit has magnetic moments of a reference layer and a free layer being perpendicular to each other, and in the reference layer and the free layer, the magnetic moment of one of the layers is parallel to a film surface, and the magnetic moment of the other layer is perpendicular to the film surface.

2. The position sensing mechanism as claimed in claim 1, wherein the encoding element moves relative to the reading element along the virtual moving axis.

3. The position sensing mechanism as claimed in claim 1, wherein the reading element moves relative to the encoding element along the virtual moving axis.

4. The position sensing mechanism as claimed in claim 1, wherein the encoding element is in a straight bar shape.

5. The position sensing mechanism as claimed in claim 1, wherein the encoding element is in an annular shape.

6. The position sensing mechanism as claimed in claim 1, wherein the magnetic moment perpendicular to the film surface is the reference layer.

7. The position sensing mechanism as claimed in claim 1, wherein the magnetic moment perpendicular to the film surface is the free layer.

8. The position sensing mechanism as claimed in claim 1, wherein the reading element further comprises a chip, and the first magneto-resistive unit and the second magneto-resistive unit are respectively formed on the chip.

9. The position sensing mechanism as claimed in claim 1, wherein the second magneto-resistive unit is a bridge tunneling magneto-resistor (TMR).

10. The position sensing mechanism as claimed in claim 1, wherein the first magneto-resistive unit has a single magnetic tunneling junction (MTJ).

* * * * *